US008856203B1

(12) United States Patent  
Schelp et al.

(10) Patent No.: US 8,856,203 B1  
(45) Date of Patent: Oct. 7, 2014

(54) SYSTEM AND METHOD FOR ALGORITHMIC TCAM PACKET CLASSIFICATION

(75) Inventors: Craig Robert Schelp, Surrey (CA); Jonathan David Loewen, Belcarra (CA); Morten Zilmer, Oelstykke (DK)

(73) Assignee: PMC-Sierra US, Inc., Sunnyvale, CA (US)

( * ) Notice: Subject to any disclaimer, the term of this patent is extended or adjusted under 35 U.S.C. 154(b) by 75 days.

(21) Appl. No.: 13/369,202

(22) Filed: Feb. 8, 2012

Related U.S. Application Data

(60) Provisional application No. 61/440,637, filed on Feb. 8, 2011.

(51) Int. Cl.
 *G06F 15/16* (2006.01)
 *H04L 29/06* (2006.01)

(52) U.S. Cl.
 CPC ........................... *H04L 29/06* (2013.01)
 USPC ............................ 709/200; 370/389; 370/392

(58) Field of Classification Search
 CPC .............. H04L 29/06; H04L 29/08072; H04L 29/08171; H04L 12/5695
 USPC .................... 370/386, 389, 392, 395.31, 310; 709/200, 230, 246
 See application file for complete search history.

(56) References Cited

U.S. PATENT DOCUMENTS

| | | | |
|---|---|---|---|
| 2004/0022082 A1* | 2/2004 | Khanna ........................... | 365/49 |
| 2005/0226235 A1* | 10/2005 | Kumar et al. ................. | 370/386 |
| 2007/0242738 A1* | 10/2007 | Park et al. ..................... | 375/224 |
| 2008/0155206 A1* | 6/2008 | Gurumurthy ................. | 711/154 |
| 2009/0135826 A1* | 5/2009 | Kim et al. ..................... | 370/392 |
| 2009/0185568 A1* | 7/2009 | Cho et al. ................. | 370/395.31 |
| 2010/0080224 A1* | 4/2010 | Panwar et al. ................ | 370/392 |
| 2010/0309917 A1* | 12/2010 | Zhang et al. .................. | 370/392 |

* cited by examiner

*Primary Examiner* — Gary Mui  
*Assistant Examiner* — Kabir Jahangir  
(74) *Attorney, Agent, or Firm* — Dennis R. Haszko (57) ABSTRACT

In a Ternary Content Addressable Memory (TCAM) optimized for network packet classification, network operation rules are preprocessed into sub-lists in accordance with a decision tree based packet classification algorithm. The decision tree is encoded as a lookup memory, which is accessed with a predetermined base address of higher order address bits combined with lower order address bits obtained from specific bit positions from a received network packet. Depending on the nodes traversed in the decision tree, different base addresses and values from different bit positions of the packet are used until a sub-list of potential rules is identified. A bitwise comparison of values of each rule against the packet is then executed, the matching rule with the highest precedence is returned as the matching table entry and the configured value associated with the entry is prepended to the packet.

17 Claims, 7 Drawing Sheets

FIG. 1

| Rule | Compare Key 0 | | Compare Key 1 | | | | Compare Key 2 | | | | Rule Sub-List 204 |
|---|---|---|---|---|---|---|---|---|---|---|---|
| 0 | 0001 | xxxx | 0001 | xxxx | xxxx | xxxx | 0101 | xxxx | xxxx | xxxx | 1 |
| 1 | 0001 | xxxx | 1010 | xxxx | xxxx | xxxx | xxxx | xxxx | xxxx | xxxx | |
| 2 | 0001 | xxxx | 0001 | xxxx | xxxx | xxxx | 1111 | xxxx | xxxx | xxxx | 3 |
| 3 | 0001 | xxxx | 1100 | xxxx | xxxx | xxxx | xxxx | xxxx | xxxx | xxxx | |
| 4 | 0001 | xxxx | 1111 | xxxx | xxxx | xxxx | xxxx | xxxx | xxxx | xxxx | |
| 5 | 0010 | xxxx | xxxx | xxxx | xxxx | xxxx | xxxx | xxxx | xxxx | xxxx | |
| 6 | 0010 | xxxx | xxxx | xxxx | xxxx | xxxx | xxxx | xxxx | xxxx | xxxx | |
| 7 | 0010 | xxxx | xxxx | xxxx | xxxx | xxxx | xxxx | xxxx | xxxx | xxxx | |
| 8 | 0101 | xxxx | xxxx | xxxx | xxxx | xxxx | xxxx | xxxx | xxxx | xxxx | |
| 9 | 0101 | xxxx | xxxx | xxxx | xxxx | xxxx | xxxx | xxxx | xxxx | xxxx | |
| 10 | 0101 | xxxx | xxxx | xxxx | xxxx | xxxx | xxxx | xxxx | xxxx | xxxx | |
| 11 | 0101 | xxxx | xxxx | xxxx | xxxx | xxxx | xxxx | xxxx | xxxx | xxxx | |
| 12 | 0101 | xxxx | xxxx | xxxx | xxxx | xxxx | xxxx | xxxx | xxxx | xxxx | |
| 13 | 0111 | xxxx | xxxx | 0010 | xxxx | xxxx | xxxx | xxxx | xxxx | xxxx | |
| 14 | 0111 | xxxx | xxxx | 0101 | xxxx | 0011 | xxxx | xxxx | xxxx | xxxx | 6 |
| 15 | 0111 | xxxx | xxxx | 0011 | xxxx | xxxx | xxxx | xxxx | xxxx | xxxx | |
| 16 | 0111 | xxxx | xxxx | 0101 | xxxx | 1010 | xxxx | xxxx | xxxx | xxxx | 8 |
| 17 | 0111 | xxxx | xxxx | 1000 | xxxx | xxxx | xxxx | xxxx | xxxx | xxxx | |
| 18 | 0111 | xxxx | xxxx | 0101 | xxxx | 0011 | xxxx | xxxx | xxxx | xxxx | 6 |
| 19 | 1000 | xxxx | xxxx | xxxx | xxxx | xxxx | xxxx | xxxx | xxxx | xxxx | |

SYSTEM AND METHOD FOR ALGORITHMIC TCAM PACKET CLASSIFICATION

CROSS REFERENCE TO RELATED APPLICATIONS

This application claims the benefit of priority of U.S. Provisional Patent Application No. 61/440,637 filed Feb. 8, 2011, which is incorporated herein by reference in its entirety.

FIELD

The embodiments of the present invention are directed to identification of a network rule from a plurality of rules for a received network packet.

BACKGROUND

Ternary Content Associated Memories (TCAMs) allow for the masked matching of entries to a search key. Masked matching facilitates search operations common in packet networking. When performing packet processing, masked matching is typically performed in several processing steps to determine next destinations, provide access control of packets into a network, identify traffic source of a packet, and other searching or matching operations. These actions are referred to as rules, which are ideally matched to a particular packet. Prior to performing each of these search operations, a search key is extracted from a packet header through parsing to determine the packet format and header contents.

Both fixed hardware and flexible firmware based solutions are used with firmware based solutions preferred in networks where the protocols used vary over time. Typical flexible implementations make use of programmable processing cores to perform analysis of header segments to determine format and extract values from the header which can be used for searching with a narrow key. Depending upon the specific implementation, performance of firmware-based solutions may be variable with the packet processing rate being non-deterministic. The parsing is required to reduce the width of the search key to something useable with available TCAM implementations. Parsing is also required to determine which fields within the header segment should be selected for the search key with different header segment types requiring different construction of the search key.

Providing TCAM functionality with support for large key widths greater than the number of header bytes of network packets allows the matching of the full header enabling parsing and searching to be performed in a single operation with no complex programming and deterministic performance.

A traditional memory-based TCAM implementation is constructed from bit cells with single bit comparison logic attached to word compare lines with a priority encoder used to indicate which compare line found a match. Such designs consume significant power as all bit cells are simultaneously read on each match operation and all bit locations for the full width of the matching patterns must be present. Additionally, support for features like range matching, longest prefix matching, or inverse matching significantly complicates the design. Finally, memory-based TCAM implementations are implementation technology specific and involve significant effort to port from one semiconductor process node to another as required when embedding TCAM functionality within a packet networking device. In response to the deficiencies of memory-based TCAMs, several algorithmic implementations have been used. Most of these implementations make use of Radix trees, HiCuts, HyperCuts, or other decision tree-try-based based packet classification algorithms for searching of patterns.

Tries are a commonly used method in searching of a data set for matching to an input search key. To perform a search, a tree is traversed as bits from the search key are compared one bit at a time from most significant to least significant bit position. With improvements, they work well for longest prefix matching of keys to the existing dataset as well. Unfortunately, traversal of the tree consumes significant time for long keys, as is required for full packet header matching, as one node of the tree is traversed per bit location in the key. Radix trees or Patricia tries improve upon the latency of searching by combining multiple bits together when they are common to all branches in a given node. However, each of these methods suffers from design challenges when masking is implemented in the search table. When a masked bit, designated as an 'x' state by example, is encountered within an entry to the search table, the value must be added to all possible branches of the node where the 'x' state is encountered. Many masked bits cause a large increase in the size of the tree. This problem is made worse when considering full packet header matching where many if not most bits of the header are masked.

HiCuts and HyperCuts are useful in dealing with masked bit locations by allowing bits to be selected for traversal of a tree from arbitrary locations within the data values. In packet networking applications where a complete packet header is used as a search key, common bit locations exist within each packet header segment that indicates the packet type and format. HiCuts and HyperCuts enable the use of these known non-masked bits for building and traversal of the search tree. Unfortunately, HiCuts and HyperCuts are not able to support fully nested prefixes that are common in IPv6.

It is therefore desirable to mitigate at least some of the above problems associated with traditional, memory-based TCAM's, thereby providing a system and method for performing masked matching of wide keys against large datasets for packet classification. In particular, it is desirable to provide a system and method for high speed packet matching to a highest precedent rule.

SUMMARY

It is an object of the present disclosure to obviate or mitigate at least one disadvantage of previous network packet classification systems.

In a first aspect, the present disclosure provides a network packet classification processing system for matching a network packet to one of a plurality of rules organized into sub-lists. The system includes a compare tree engine and a serial match engine. The compare tree engine receives the network packet and iteratively accesses a preconfigured look up table using data values obtained from the network packet at specific bit positions designated by at least one predetermined bit extraction pattern until either a null value or a first pointer to a sub-list is returned from the look up table. Different predetermined bit extraction patterns are selected for a subsequent iteration in response to the look up table providing a second pointer for accessing one of the different predetermined bit extraction patterns. The serial match engine executes a linear search of each rule in the sub-list to identify a highest matching precedent rule to preselected bit position values of the network packet. According to a present embodiment, each of the predetermined bit extraction patterns includes a corresponding base address having higher order values to which the data values obtained from the network packet are added as lower order values, such that a final address including a combination of the base address and the data values are used for accessing the look up table. In this embodiment, the compare tree engine includes a data selector receiving data corresponding to all bit positions of the network packet, where the data selector is configured to provide only the data values corresponding to the specific bit positions of the network packet designated by each of the predetermined bit extraction patterns.

In a particular aspect of this embodiment, the look up table includes a branch memory and a node memory, where the branch memory and the node memory are accessed in each iteration when the second pointer for accessing one of the different predetermined bit extraction patterns is provided from a previous iteration accessing the branch memory and the node memory. The branch memory reads out contents addressed with the final address, where the contents include the null value, the first pointer to a sub-list or the second pointer. The compare tree engine can further include evaluation logic for receiving the contents from the branch memory and determining further actions in response to the contents. The further actions can include flushing the packet from the pipeline when the null value is received, outputting the first pointer to the serial match engine, and accessing the node memory with the second pointer.

According to another aspect of the previously described embodiment, the evaluation logic provides the second pointer to the node memory as an address, the node memory reading out one of the predetermined bit extraction patterns and a corresponding base address in response to the address. In this embodiment, the data selector adds the corresponding base address to the data values to form the final address. The node memory further stores a number of bits of interest with each of the predetermined bit extraction patterns and the corresponding base addresses, and the data selector limits the subset of the bits to the number of bits of interest provided with the corresponding predetermined bit extraction patterns and corresponding base addresses.

In yet another embodiment of the present aspect, the serial match engine includes a field selector and a comparator. The field selector selects the preselected bit position values of the network packet in response to a rule format of a selected rule of the sub-list. The comparator executes bitwise comparison of the preselected bit position values against data values of the selected rule, for providing a match indication and corresponding priority level for the selected rule when the preselected bit position values match the data values of the selected rule. In this embodiment, the field selector is a first field selector, the comparator is a first comparator, and the selected rule is a first selected rule. The serial match engine further includes a second field selector and a second comparator. The second field selector selects another set of preselected bit position values of the network packet in response to a rule format of a second selected rule of the sub-list. The second comparator executes bitwise comparison of the another set of preselected bit position values against data values of the selected rule, for providing another match indication and corresponding priority level for the second selected rule when the another set of preselected bit position values match the data values of the second selected rule.

In one aspect of the present embodiment, there is further included a priority comparator configured for determining which of the match indication and the another match indication has a higher priority. Alternately, the priority comparator can be configured for providing a compound match indication when the match indication and the another match indication is received.

In a second aspect, the present disclosure provides a compare tree engine for matching a network packet to at least one rule for a network packet classification processing system. The system includes a look up memory and match circuitry. The look up memory stores one of a null value indicating the absence of a match, a match result corresponding to at least one rule, and decision node information. The look up memory provides one of the null value, the match result and the decision node information in response to a final address. The match circuitry receives the null value, the match result and the decision node information, and either outputs the match result, flushes the network packet when the null value is received, and provides a new final address in response to the decision node information. According to a first embodiment, the match result includes a matching rule for the network packet. According to a second embodiment of the second aspect, the decision node information includes a base address and a bit extraction pattern for selecting data values from the network packet at specific bit positions. In this second embodiment, the match circuitry includes a data selector for receiving data values from all bit positions of the network packet, and for combining the base address with the data values at the specific bit positions of the network packet specified by the bit extraction pattern, as the new final address. The match result includes a pointer to one of a plurality of sub-lists of rules, and the look up memory provides the decision node information.

The match circuitry further includes evaluation logic for receiving the null value, the pointer to a sub-list of rules, and the decision node information, the evaluation logic providing the base address and the bit extraction pattern of the decision node information to the data selector. In an aspect of this embodiment the pointer to a sub-list of rules is a first pointer, and the decision node information includes a second pointer the match circuitry includes a node memory for storing different base addresses and corresponding bit extraction patterns. The node memory providing a base address and a corresponding bit extraction pattern in response to the second pointer. The look up memory provides the second pointer, and the match circuitry further includes evaluation logic for receiving the null value, the first pointer, and the second pointer, the evaluation logic outputting the second pointer as an address to the node memory.

In a third aspect, the present disclosure provides a serial match engine for matching a network packet to a rule of a sub-list of rules for a network packet classification processing system. The serial match engine including a field selector and a comparator. The field selector receives a plurality of data values of the network packet, for selecting a group of the data values of the network packet from specific bit positions in response to a rule format of a selected rule of the sub-list. The comparator executes bitwise comparison of the group of the data values against data values of the selected rule. The comparator provides a match indication and corresponding priority level for the selected rule when the group of the data values match the data values of the selected rule. According to an embodiment of the third aspect, the field selector is a first field selector, the comparator is a first comparator, and the selected rule is a first selected rule, and the serial match engine further includes a second field selector and a second comparator. The second field selector selects another set of preselected bit position values of the network packet in response to a rule format of a second selected rule of the sub-list. The second comparator executes bitwise comparison of the another set of preselected bit position values against data values of the selected rule, for providing another match indication and corresponding priority level for the second selected rule when the another set of preselected bit position values match the data values of the second selected rule. In one aspect, there is further included a priority comparator configured for determining which of the match indication and the another match indication has a higher priority. In another aspect, there is further included a priority comparator configured for providing a compound match indication when the match indication and the another match indication is received.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a method and system for providing single pass packet parsing and classification using a single wide search operation. An algorithmic TCAM optimized for packet networking can be created for embedding within a packet networking device. Using a combination of techniques, embodiments of the invention include a search engine that can have one or more of the following properties/features:

is area and power efficient;
has high processing throughput with deterministic latency;
is scalable;
supports nested prefixes;
supports large amounts of variable masking;
supports range matching; and,
supports the compounding of entries within the search table to create complex rule sets.

Embodiments of the present disclosure provide a method for performing masked matching of wide search keys against large datasets for packet classification. Referring to the network packet classification processing system of FIG. 1, a large logical table (not shown) according to some embodiments is provided to contain rule entries that are matched against packets present on a data pipeline 102. When a match is found a packet has been classified and a flow identifier is inserted into a pre-pended packet header. To increase the speed of the matching logic and reduce the number of comparators necessary to match a packet against all rules, the rule table can be split into multiple sub-lists through preprocessing. For the presently described embodiments, any algorithm for setting the sub-lists can be used. In one example, a decision tree in the data path implemented with a variable stride HyperCut is traversed to determine which sub-list contains rules that may match a received packet. Once a sub-list of potential candidates is identified, a series of comparators may be used to perform a masked matching operation between the key and all candidate entries. The matching candidate with the highest precedence is returned as the matching table entry and the configured value associated with the entry is prepended to the packet.

Figure 1:
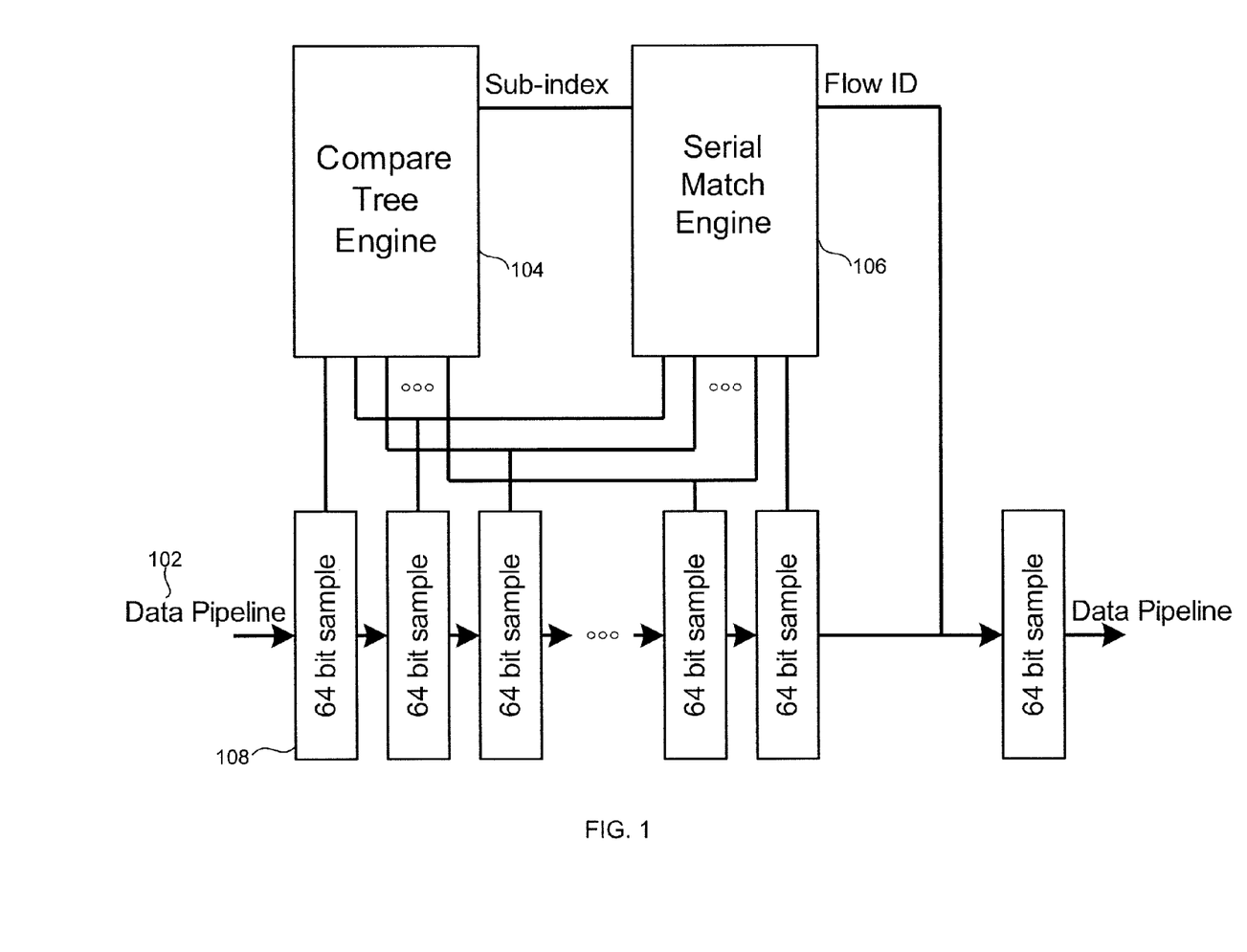
FIG. 1 is a functional block diagram of an algorithmic TCAM network packet classification processing system according to a present embodiment.

According to some embodiments of the present disclosure, the Compare Tree Engine 104 is used to perform a protocol agnostic evaluation of a packet 108, which by example can be 128 bytes in size, to determine likely candidates for exact matching of rules. FIG. 1 shows an example configuration where the pipeline width is 64 bits, which is selected based on a desired data rate in excess of 20 Gbps and an operation frequency of 400 MHz. Accordingly, the 128 bytes of the packet 108 are buffered. However, the presently described embodiments are applicable to systems having any pipeline width and operating frequency. The decision tree implemented in the Compare Tree Engine 104 is a hybrid hardware and software implementation of a variable stride HyperCut which is able to quickly identify possible candidate matching rules. A serial matching process inside the Serial Match Engine 106 is used to fully determine a matching rule from the sub-list of candidates through a bitwise comparison of selected bits of the packet against values of the rule. Reducing the full rule set to a small sub-list of candidates enables faster operation and easier scaling of the number of supported rules.

Figure 2:
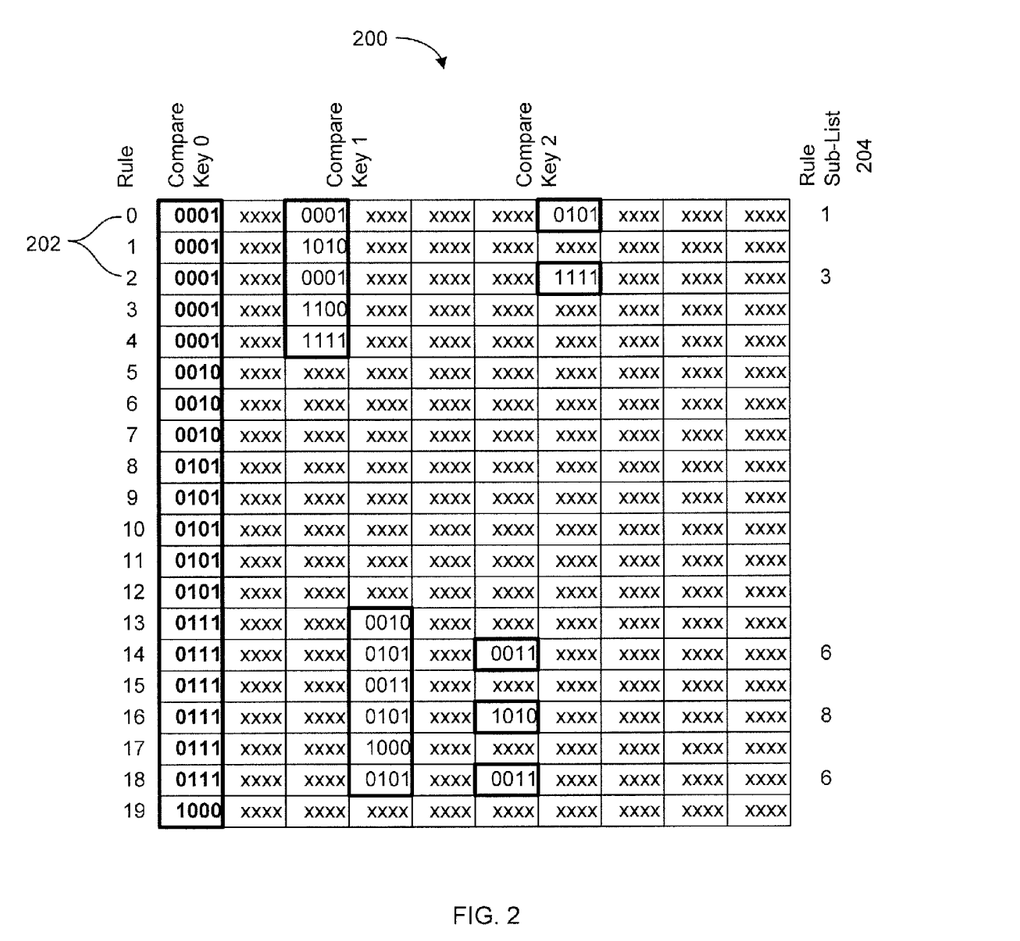
FIG. 2 is a graphical example of a table implementing rule slicing according to a present embodiment.

In some embodiments, rule slicing can be performed in firmware to reduce the full rule set into sets of sub-lists. By example, each sub-list can be limited to containing not more than 64 rules. A graphical example of rule slicing is shown in FIG. 2. The example shown in FIG. 2 uses 4 bits at each node. The rule table 200 should be viewed as a flat binary matrix with 'x' states for masked values permitted for bit locations. Each rule 202 occupies one row of the matrix. A column by column analysis of the matrix will be able to find a column that has the fewest number of 'x' values and the most even number of '1' and '0' values. This column, or bit location, would be the bit selected for a decision in a decision tree. Each branch of the tree will now have fewer rules 202 that can possibly match the packet.

The first branch can contain a list of all rules 202 with a '0' or 'x' in the chosen column. The second branch can contain a list of all rules 202 with a '1' or 'x' in the chosen column. Choosing a column with few 'x' values will minimize the replication of rules 202 in multiple sub-lists 204. This analysis is performed as a recursive process. Taking the sub-list 204 from the first branch, the rules 202 are again viewed as a binary matrix from which a differentiated bit can be selected. This sub-list 204 would be further divided. The process is continued until all sub-lists 204 contain fewer than a maximum imposed number of entries, such as 64 entries by example. To further accelerate the reduction in size of the sub-lists 204, multiple (n) bits are evaluated per cycle creating a maximum of 2n sub-lists 204 per node of the tree.

If the tree were completely balanced with no 'x' values in columns of interest a 4096 entry rule table could be reduced to 16 entry sub-lists in only 2 iterations when 4 bits are selected for evaluation. The implementation example provides for 8 iterations of slicing with a variable number of bits between 2 and 10 to allow for imbalance and more importantly, 'x' values in the columns of interest. In the present embodiments, analysis of the rules to create the decision tree occurs in firmware running on a host processor.

Figure 3:
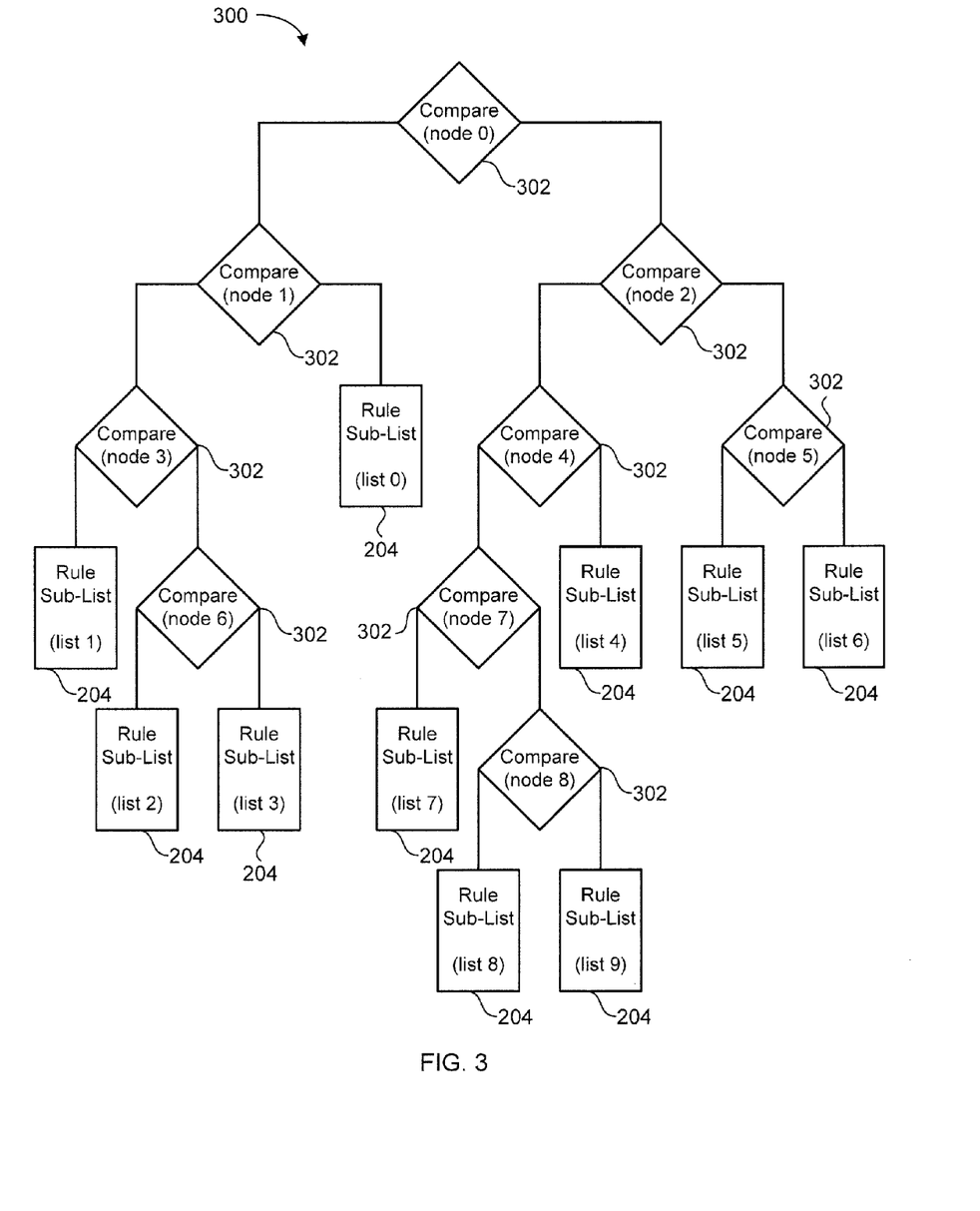
FIG. 3 is an example of a Compare Engine Decision Tree according to one embodiment.

Referring to FIG. 3, the compare decision tree according to certain embodiments is a hierarchical view of the of sliced rule set. A graphical presentation of an exemplary, binary decision tree 300 is shown. At each compare node 302, a look-up is performed using the value of bits in the incoming packet at bit locations of interest. Based upon the result of the look-up the next level of the tree 300 can be traversed. Any given look-up can result in no match found, a pointer to a sub-list 204, or a pointer to another compare node 302. Associated with each compare node 302 is a selection of the bit locations of interest for the next comparison, which takes into account the look-up conducted with the bits of interest from a previous compare node 302. While FIG. 3 shows only an example of a binary tree 300 according to certain embodiments, the decision tree encoded within the Compare Tree Engine 104 can be a 2n-way tree where n is the number of bits evaluated at a node.

Figure 4:
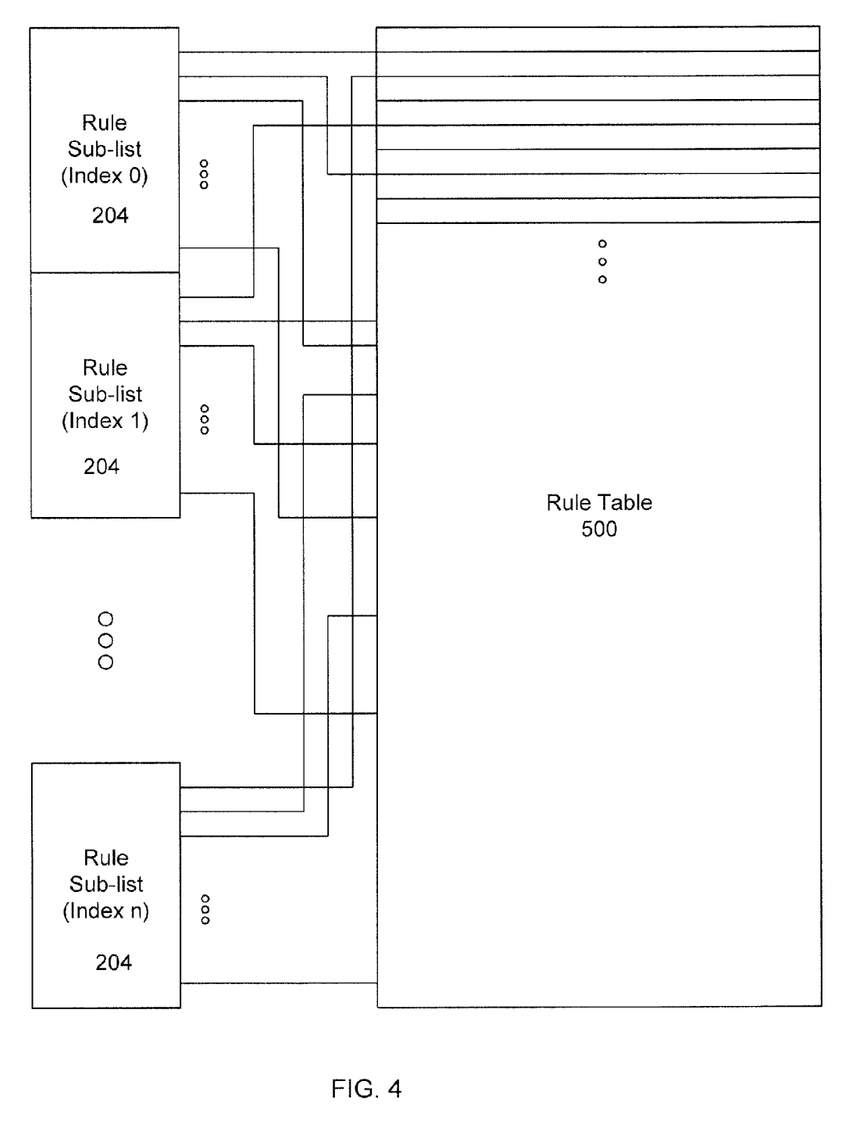
FIG. 4 is an example of a Sub-list to Rule Table Mapping.

Use of the compare tree enables reduction of the large rules list into a small list of candidate rules, organized as sub-lists, with an O(log n) algorithm. FIG. 4 shows an example of the mapping from a sub-list in the compare decision tree to the entries in the rule table 500 in accordance with some embodiments of the present disclosure. Sub-lists 204 are a table of pointers contained in an internal RAM. The result returned by a comparison in the decision tree is an address location to the start of a sub-list along with the size of the sub-list 204. Each entry in the sub-list 204 points to an entry within the large rule tables.

Figure 5A:
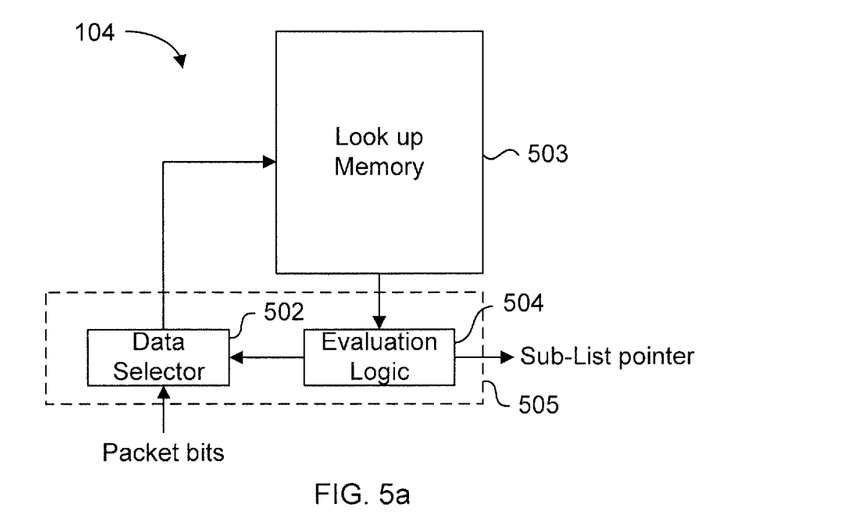
FIG. 5a is a block diagram of a Compare Engine, according to a present embodiment.

A block diagram of the Compare Tree Engine 104 according to one embodiment is shown in FIG. 5a. More specifically, FIG. 5a shows an embodiment of the Compare Tree Engine 104 previously shown in FIG. 1. The Compare Tree Engine 104 generally includes a Data Selector 502, a Lookup memory 503, and Evaluation logic 504. The Data Selector 502 and the Evaluation logic 504 are considered part of Match circuitry 505, which receives a null value, a match result and decision node information from the Lookup memory 503. The match result can include either a pointer to a sub-list of rules, or a matching rule. The decision node information can include a base address and a bit extraction pattern.

The Data Selector 502 receives data corresponding to all bit positions of the network packet (Packet bits) received in the data pipeline 102, and is responsible for providing data values corresponding to the specific bit positions of the network packet as designated by different predetermined bit extraction patterns. Furthermore, the Data Selector 502 concatenates or adds a received base address from Lookup memory 503 to these data values selected from the network packet, as dictated by the bit extraction pattern stored in the previously addressed location of Lookup memory 503. The data corresponding to these bit positions is also referred to as a search key. As will be discussed in further detail later, these data values are used as part of a final address for accessing contents of Lookup Memory 503. Based on the received final address, the Lookup Memory 503 provides or reads out contents stored at the final address, which can include one of a null value, a match result which can include a pointer to a sub-list of rules, or one of a plurality of different predetermined bit extraction patterns. The Evaluation logic 504 is configured for determining each of the three possible results read from Lookup Memory 503. The null value indicates that there is no match of a rule to the network packet, and packet is then flushed from the pipeline. The pointer to the sub-list of rules indicates that a match of at least one rule to the network packet has been found, and the best matching rule may be found in the predetermined sub-list of rules.

When such information has been identified by the Evaluation logic 504, a pointer to the selected sub-list (Sub-list pointer) is passed on to the Serial Match Engine 106. A returned predetermined bit extraction pattern indicates that a potential matching rule has been found in at least 2 sub-lists, and that further searching is required. Accordingly, the Evaluation logic 504 provides the new predetermined bit extraction pattern, a corresponding base address consisting of higher order bits, and optionally, a corresponding number of bits of interest. This additional information is included in the contents returned by the Lookup Memory 503. It is noted that the Evaluation logic 504 needs only assess particular bits of the read contents of the Lookup Memory 503 in order to determine what action to take. It is noted that each address of the Lookup memory 503 and the corresponding contents have been configured based on the rule slicing algorithm used to establish the rule sub-lists and the decision tree model, such as the example decision tree shown in FIG. 3.

Figure 5B:
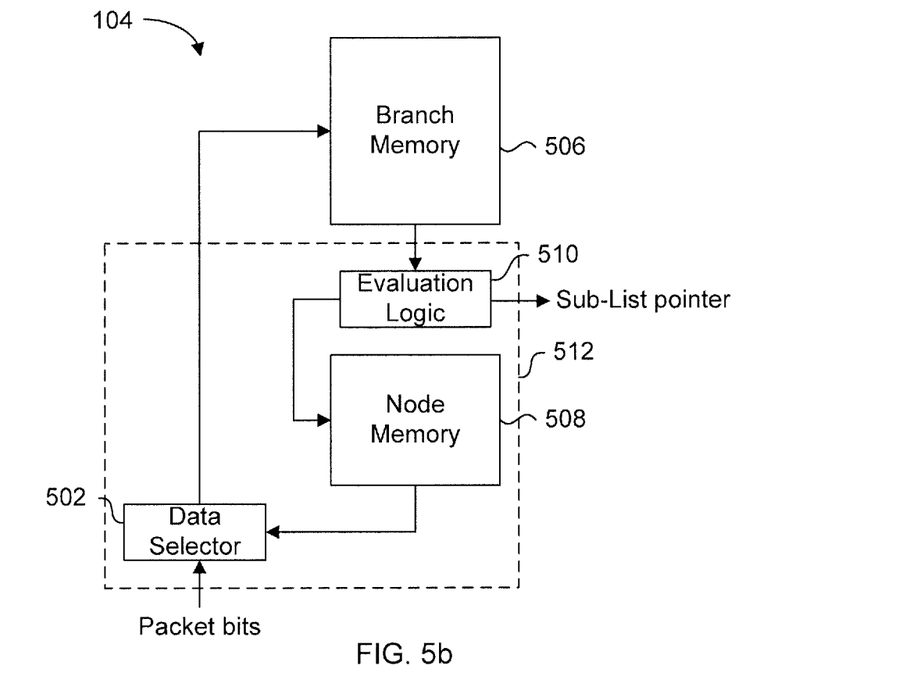
FIG. 5b is a block diagram of a Compare Engine, according to an alternate embodiment.

Another block diagram of the Compare Tree Engine 104 according to an alternate embodiment is shown in FIG. 5b. While the embodiment of FIG. 5a can be operated with a low level of latency, this requires a large Lookup Memory 503 to account for the definition of bit selections when higher numbers of bits for cutting is supported. If it is not cost effective to include a large memory on-chip, then the embodiment of FIG. 5b can be used to reduces the overall memory requirement. The Compare Tree Engine 104 embodiment of FIG. 5b splits the previously used Lookup Memory 503 of FIG. 5a into two separate memories. These are referred to as a Branch memory 506 and a Node memory 508. The Data Selector 502 can be the same as the one previously described for the embodiment of FIG. 5a.

The Data Selector 502, the Evaluation logic 510 and the Node memory 508 are considered part of Match circuitry 512, which receives a null value, a match result and decision node information from the Branch memory 506. The Branch memory 506 and the Lookup memory 503 are effectively the same, with the difference being some of the types of information stored therein. The match result can include either a pointer to a sub-list of rules, or a matching rule. In this embodiment the decision node information can include a pointer to a location where a base address and a bit extraction pattern are stored. The function of the Match circuitry 512 is the same as for Match circuitry 505 of FIG. 5a.

The Branch memory 506 receives a final address for accessing a row of data stored therein. The final address includes a base address consisting of predetermined higher-order bits, and lower order bits obtained from the predetermined bit positions of the network packet as dictated by a predetermined bit extraction pattern. The branch memory provides or reads out the contents stored at the final address location, which can include a null value, a first pointer to a rule sub-list, or a second pointer which is used as an address for accessing the Node memory 508.

Evaluation logic 510 functions similarly to Evaluation logic 504, and upon receiving the read out data from Branch memory 506, determines the next course of action based on the received data. The null value and the first pointer are treated in the same manner as described above for FIG. 5a. Receipt of the second pointer indicates that a potential matching rule has been found in at least 2 sub-lists, and that further searching is required. Accordingly, the Evaluation logic 510 accesses the Node memory 508 using the pointer received from Branch memory 506 for reading out additional information and executing the further search based on the previous search results. The Node memory 508 then provides or reads out the new predetermined bit extraction pattern, a corresponding base address consisting of higher order bits, and optionally, a corresponding number of bits of interest, which are provided to the Data Selector 502. The Data Selector 502 concatenates or adds the base address with the bits of interest to form a final address for accessing the Branch memory 506. The process then repeats again by accessing the Branch memory 506 with the final address until either no match is found or a sub-list pointer is found. Once again, each address of the branch memory 506 and Node memory 508, and their corresponding contents have been configured based on the rule slicing algorithm used to establish the rule sub-lists and the decision tree model, such as the example decision tree shown in FIG. 3.

For both the embodiments of FIGS. 5a and 5b, 3 pieces of information are used together to form the final address for the branch memory. First is the base offset address. Second are the bits selected from the network packet as selected by the Data Selector. Third is the number of bits of interest. This number of bits corresponds to a stride length for the hypercut, such as 1-bit, 2-bits, 3-bits, 4-bits, etc. In an example generation of the final address, the selected number of bits from the output of the Data Selector are added to the base offset address to create the final address. The least significant bit of the address can be removed before performing a read operation on the Branch memory. Each address location in the Branch memory can include 2 data words. This least significant bit of the total address field is used to select which of the two data words (15 bits) is valid. The benefit of this approach is improved ECC efficiency of the memory.

It is noted that the embodiments of FIGS. 5a and 5b can be configured to provide a matching rule instead of a pointer to a sub-list of rules. This can be done if the when the Hypercut, or any decision tree-try-based based packet classification algorithms for searching of patterns, is resolved to identify a single entry. Therefore, the embodiments of FIGS. 5a and 5b provide a match result, where the match result can include either a matching rule, or a pointer to one of a plurality of sub-lists of rules, which can be subsequently used by the Serial Match Engine 106 to identify the matching rule from the selected sub-list.

Figure 6:
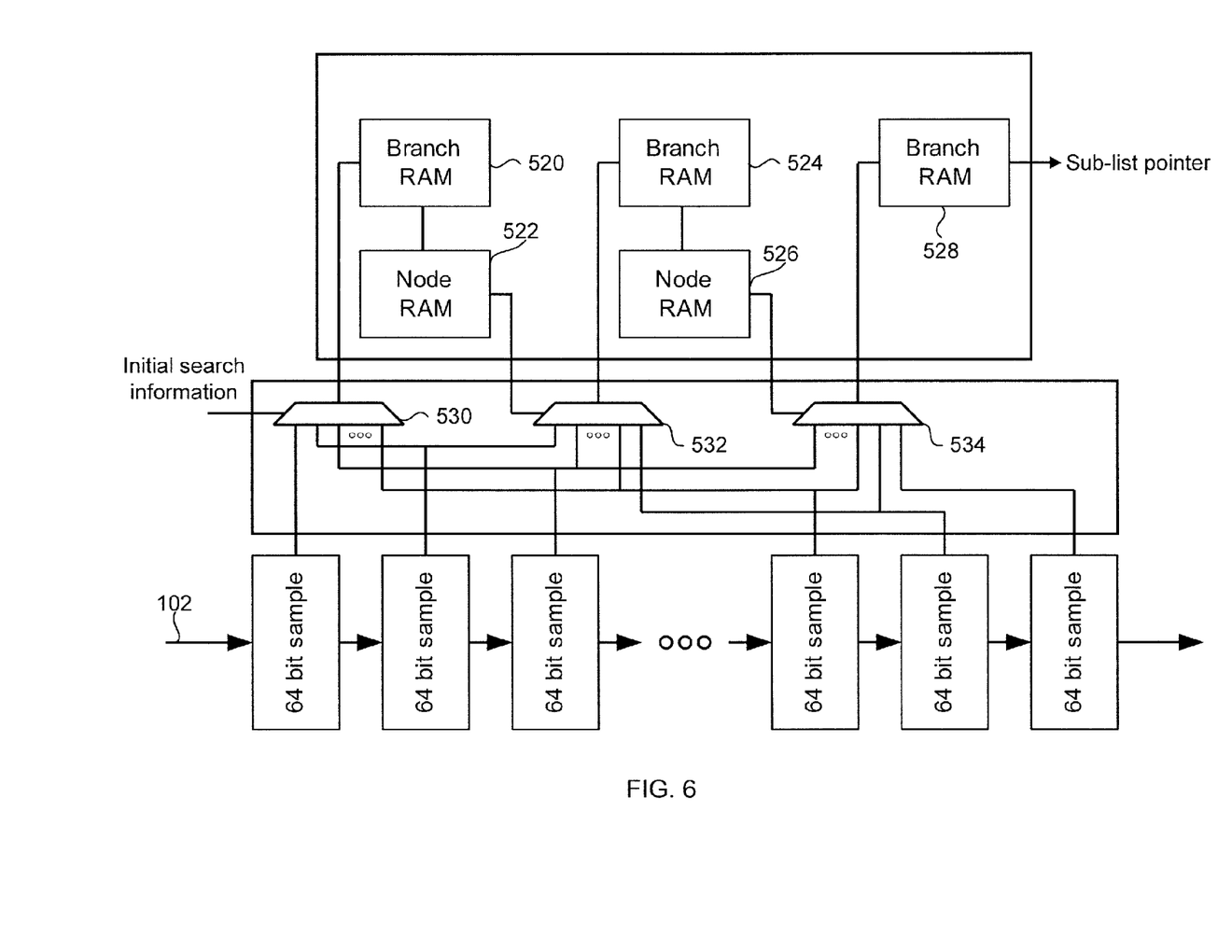
FIG. 6 is a conceptual illustration of the Compare Engine of FIG. 5b used in an example operation.

An example operation of the Compare Tree Engine 104 with the arrangement shown in FIG. 5b is now described for facilitating an understanding of the network packet classification method. FIG. 6 is a conceptual diagram showing how the search is carried out sequentially, using an example of the decision tree of FIG. 3. In this example, separate instances of pairs of a branch memory and a node memory are shown. The Evaluation logic 510 is intentionally omitted in order to simply the drawing. In this example, individual Data Selectors are shown, where each is associated with each of the branch memories. These separate instances of the branch memory, node memory and data selector are actually the same physical branch memory, node memory and data selector, but are shown as virtual instances to demonstrate the iterative nature of the search. Each pairing is used in each iteration of the search for a rule sub-list. Each branch memory receives a final address for accessing a row of data stored therein. The final address includes a base address consisting of predetermined higher-order bits, and lower order bits obtained from the predetermined bit positions of the network packet as dictated by the predetermined bit extraction pattern. It is noted that each address of the branch memory and the corresponding contents have been configured based on the rule slicing algorithm used to establish the rule sub-lists and the decision tree model, such as the example decision tree shown in FIG. 3. In response to the received final address, the branch memory provides the contents of the data stored at the final address. Depending on the final address, the data can include the null value, the first pointer to a rule sub-list, or the second pointer. In the event of a received null value, Evaluation logic will instruct the system to flush the network packet.

The search starts when data passes through a pipeline 102. As 128 bytes of a packet enter the pipeline, traversing of the decision tree is initiated. The first comparison is a slicing of the rule set based upon port ID as encoded in a pre-pended header, which is executed using simple logic circuitry. Based upon the port-ID look-up, initial search information including an initial base address and a predetermined bit extraction pattern are provided to Data Selector 530. Each clock cycle or iteration thereafter, a Data Selector selects the bits of interest from the network packet which are used as address bits for the associated branch memory. The value returned by the branch memory determines the action taken in the next clock cycle or iteration. In the present example Branch memory 520 provides a second pointer to Node memory 522. If the second pointer is received from Branch memory 520, this pointer is used as an address to access Node memory 522. This corresponds to traversing the decision tree of FIG. 3 to a compare node 302. The address location of Node memory 522 provides a corresponding base address and a corresponding predetermined bit extraction pattern which is then used for the subsequent iteration of the search. Data Selector 532 then selects new bits from the network packet, and provides a new final address to Branch memory 524. It is assumed that Branch memory 524 provides a second pointer to Node memory 526. This corresponds to traversing the decision tree of FIG. 3 to another compare node 302. Thus a new base address and corresponding predetermined bit extraction pattern is provided by Node memory 526 to Data Selector 534. It is assumed that Branch memory 528 receives a final address from Data Selector 534 that returns a first pointer to a sub-list. These are by example, node 6, node 8, or node 5 in FIG. 3. This pointer is the starting address of a specific sub-list, such as any one of sub-lists 204 of FIG. 4 by example.

In the present example, a new minimum sized packet will eventually pass the start of the pipeline 102 with a minimum inter-packet spacing of 8 clock cycles giving the opportunity to traverse 8 levels of hierarchy within the compare decision tree for each packet at full line rate. An additional clock cycle between packets is provided by the presence of the pre-pended packet and fragment headers which is used to guarantee software access to update the look-up table while the tree is not being traversed. In this example, each data word within the Branch memory 506 contains information for four branches of the of a compare node 302. The soft encoding of the compare decision tree into the Branch memory 506 and the Node memory 508 by the processor allows for the support of an arbitrary decision tree. By synchronizing microprocessor accesses to frame boundaries, in place updates can be made to the decision tree without interrupting the data packet flow through the compare tree engine.

In certain embodiments, once a sub-list of candidate rules has been identified by the Compare Tree Engine 104, the Serial Match Engine 106 can be used to perform a full match of the incoming key against each rule 202 in the sub-list 204. The matching rule 202 with the highest encoded priority is identified and an associated stored value is returned and inserted into packet header. The principles of operation of the serial match engine 106 is now described.

The Compare Tree Engine 104 according to certain embodiments of the present disclosure provides a pointer to memory location of the selected sub-list 204. The sub-list 204 is encoded in the form of a sub-list table stored within a memory instance that contains all sub-lists 204. A sub-list table is a two dimensional matrix with rows and columns. Each column represents a separate physical rule table. Each row represents those rules which are evaluated in parallel against an incoming key. Use of multiple physical rule tables with pre-processed ordering of accesses per sub-list ensures that multiple rule entries may be read within each clock cycle enabling the use of area efficient single port memory (ie. SRAM) instances. Sufficient parallelism can be provided to enable the matching of 64 entries within the interval of time which a minimum sized 64 byte packet occupies the data pipeline 102. In the case of a 64 bit data path 8 columns are required. The numerical values mentioned above are for a particular example embodiment, however the principles discussed here are applicable to any number of entries and any minimally sized packet.

A rule definition can be divided into two parts. The first part indicates the rule format, rule precedence and the stored value associated with the entry. The second part contains the exact values and mask that the selected bytes of a packet are matched against.

According to an embodiment, selection of the packet fields used in a rule and the format of those fields are configured by the rule format. By example, bits from a total of four fields selected from the network packet are concatenated together, and this new shortened 32 bytes of information is then compared with the exact bit values and bit masks provided in the second part of the rule definition. The second part of the rule definition only contains 32 bytes worth of ternary values (0, 1, x—by way of enable). This type of rule compression can be used since it has been discovered that no more than 32 bytes of a packet are needed to fully classify the service flow across all of the protocol headers. Hence, there is only the need to store enough exact values for 32 bytes rather than 128 bytes that would be necessary in traditional TCAM implementations. While the present example uses a total compare length of 32 bytes (256 bits), any suitable total compare length can be arrived at by analyzing the data patterns of the rule set. Each of the fields can be configured for either a masked equivalence or masked non-equivalence match. One of the fields may alternatively be configured for range verification matching either in range or out of range values. The priority or precedence encoding allows the stacking of rules. Only the matching rule with highest precedence is declared a match for a particular search. Using encoded precedence allows the support nested prefixes where lower precedence is encoded for each subsequent nesting in the desired prefix. If a key matches the more specific un-nested prefix defined in a rule, the more specific match will be returned as it has a higher encoded precedence. The HyperCut portion of the pipeline will always result in the most specific possible matching rule to be present within the selected sub-list along with the less specific nested prefixes. Support of 64 entries within the sub-list enables support of fully nested IPv6 prefixes.

Figure 7:
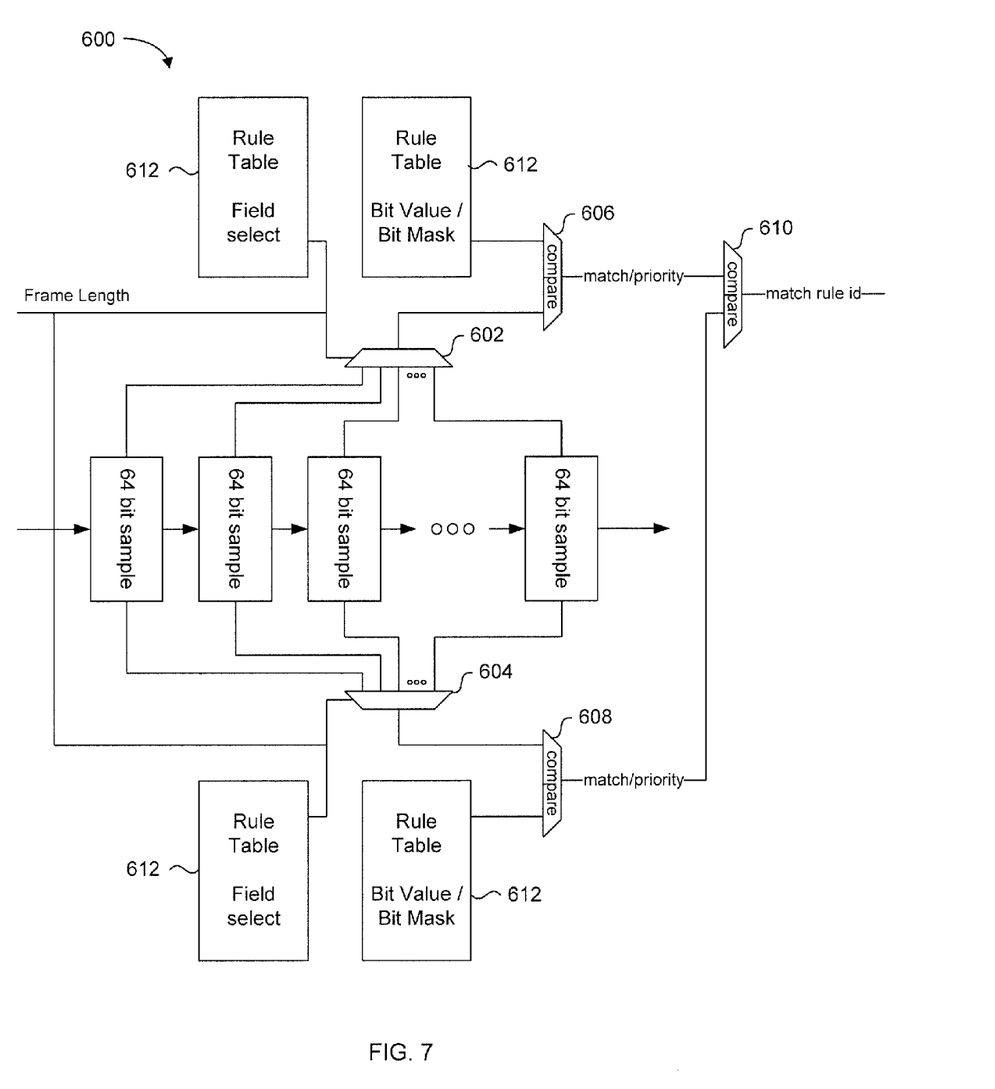
FIG. 7 is a block diagram of a Serial Match Engine according to a present embodiment.

In accordance with certain embodiments, a pipelined architecture can be used for performing a serial matching of all rules in the selected sub-list 204 against the received packet present in the data pipeline 102. A block diagram for a Serial Match Engine 600 according to one embodiment is shown in FIG. 7. In the embodiment of FIG. 7, the Serial Match Engine 600 is configured for comparing values of the network packet resident in the pipeline against 2 different rules at the same time, or in the same compare cycle, in order to increase throughput. Serial Match Engine 600 includes a first field selector 602, a second field selector 604, a first comparator 606, a second comparator 608, and a priority comparator 610. Field selectors 602 and 604 each receive values from every bit position of the received network packet resident in the pipeline. Instances of the rule table 612 are shown in FIG. 7 for providing field select values to field selectors 602 and 604. Similarly, instances of the rule table 612 are shown for providing values of the rules to first comparator 606 and second comparator 608. In actual implementation, a single rule table such as rule table 500 shown in FIG. 4 is used, and controlling logic selects the specific rules of the selected sub-list from the Compare Tree Engine 104.

In the event that packets shorter than 128 bytes are received, the Frame Length input is used to ensure that for packets shorter than 128 bytes, rules that attempt to match undefined bit locations beyond the end of the packet will not return a match. This is matched against a length encoded for each rule in the first part of the rule definition.

The first comparator 606 and the second comparator 608 perform bitwise comparison between values of the selected rule from rule table 612 and values obtained from the selected fields of the network packet. Since 2 rules are compared to the network packet at the same time, it is possible that both result in a match result. In this situation, each match result includes a priority level assigned to each rule that matched. These results are sent to the priority comparator 610, which decides which of the matching rules has the highest priority. Alternately, priority comparator 610 can be configured to confirm that 2 different rules from the same sub-list both match the network packet. In this situation one of the rules takes precedence in accordance with a predetermined ordering and the corresponding information is added to the packet.

Further increased parallelism can be achieved by including more comparators, to increase match throughput. While the present embodiment of FIG. 7 is capable of comparing 2 rules to the selected fields of the packet concurrently, any number of comparators can be included to further increase parallelism of the search. By example, an embodiment of 8 comparators allows 8 rules to be compared in parallel to the packet, thereby enabling a maximum 64 rules in a sub-list to be compared within 9 clock cycles that a minimum size packet is resident within the data pipeline.

Following is an example operation of the Serial Match Engine 600. Using the pointer provided by the Compare Tree Engine 104, the sub-list 204 is read and processed row by row. Each column is attached to an independent serial matching logic and table memories. Use of columns to separate in space the rules that may be applicable to a packet based upon the HyperCut enables distribution of rules across multiple physical memory instances as required to ensure that read ports on memory instances are never oversubscribed. Additional parallelism is added as bandwidth requires allowing the engine to support very high packet processing rates.

When a row is retrieved from the sub-list table, the pointers contained in each populated column are used to retrieve the rule format for the selected rules. Using the rule format, a corresponding field selection code is provided to field selector 602 (or field selector 604), and the appropriate bytes of the packet are concatenated together and then compared with the rule data values using a bitwise comparison by the first comparator 606 (or the second comparator 608). Selection logic of the priority comparator 610 is used to combine the match indications from each of the parallel matching logic to determine which matching rule has the highest encoded precedence. The selection logic, configured by the rule formats, also enables the combining of rules into compound rules where multiple rules are required to match the same packet before a match is declared. As there is no guarantee of ordering of rules within a sub-list relative to their precedence, all rules present in the sub-list are processed to ensure that the matching rule with highest precedence is returned. To conserve power, once a match has been found within the sub-list, rules of lower precedence can be ignored and not processed.

Under certain embodiments, the use of firmware defined values for a memory based hardware implementation allows deterministic line rate performance with the flexibility and functionality of a firmware based implementation. All comparisons and matching of a packet occur in hardware with deterministic latency enabling performance guarantees. All rule additions, processing of decision trees, and allocation of memory occurs offline in firmware with the ability to perform hardware updates synchronized to packet boundaries.

The algorithms used in determining the optimal slicing of rules for the HyperCut may be entirely implemented in firmware allowing updates to algorithms if necessary depending upon the data set being added to an algorithmic TCAM. In accordance with several embodiments, no fixed structure is imposed upon the decision tree 300 other than the maximum decision depth and total number of compare nodes 302 allowing imbalanced trees to be created and supported.

The sub-list memory, being the memory which stores the sub-lists 204 of FIG. 4, can be partitioned at run-time under firmware control allowing the support of as many sub-lists 204 as desired up to the maximum total available space. Compounding of rule entries can enable the creation of a cross-product of rule collections where rules are only stored once within the rule tables but have multiple pointers within the sub-lists 204. Using firmware to allocate the sub-list tables can allow on-demand creation of additional sub-list groups that point to compounded rules. The sub-list pointers are significantly less costly in area than rules within the rule tables reducing the cost of supporting complex matching filters for packet traffic.

In certain embodiments, the rule tables offer bulk storage of rule entries across multiple table instances with no fixed relationship between a rule and its memory location. When a new rule is added, the correct sub-list is first calculated in firmware to determine which columns within the sub-list table are free. From the list of free columns which relate to rule table instances, a rule table is selected which has free space. A rule is then added in the free memory space and a pointer added to the sub-list. With no fixed relationship between the rule and the rule tables, certain embodiments allow a rule to be added in any rule table with sufficient available storage space. If necessary, under firmware control, re-insertions of rules can occur to rebalance pointers between columns of the sub-list allowing full utilization of all memory locations within all rule table instances.

Embedded memory utilization of the rule tables is optimized through use of the hybrid firmware and hardware implementation. As rule slicing occurs in firmware, the fully expanded view of rules exists only on the host processor where memory is significantly less expensive due the use of common DDR memory devices. The rule tables in embedded memory contain only the compressed data necessary to perform exact matches using filed definitions and values for enabled bytes. This innovation can allow for the implementation of a TCAM that effectively operates over very wide widths comprising the full header of a data packet which may occupy up to 128 bytes when several layers of encapsulation are present.

An exemplary embodiment of an Enhanced Algorithmic TCAM of the present disclosure is provided as a network packet classification processing system as part of a system-on-a-chip (SoC). A software based model is provided in an example embodiment, with a completed device driver and sample data sets. In another embodiment, the network packet classification processing system is provided as part of a next generation packet networking device.

All network packet processing solutions require efficient matching of keys to large data sets. By enabling the use of very wide keys, the processing of building search keys from received packets is simplified. Embodiments of the present disclosure provide for the matching of keys comprising the entire header of networking packets, removing the need for packet parsing to build a search key. Enhanced features are also provided by example embodiments that are useful in networking applications such as in range and out of range matching, compound rules and precedence encoding for rules allowing nested rules to be supported. For networking applications, embodiments of the present disclosure are less than a quarter the size of existing memory based TCAM implementations allowing for TCAM functionality to be integrated in low cost data networking devices. Further, as one of ordinary skill in the art will appreciate, example embodiments are independent of technology node and are easily ported from one node to the next, enabling their use in a variety of technology nodes as required for use in various semiconductor devices.

Embodiments of the present disclosure provide a packet filtering system and method, such as using a HyperCut, to reduce the dataset of possible matches to below a maximum number of entries followed by a serial matching of entries by parallel comparators. This implementation uses 64 as the maximum number of entries, as it allows the support of longest prefix matching of IPv6 address when using nested prefixes. A HyperCut alone can not resolve nested prefixes.

In an example embodiment, an indirect table of sub-lists, or sub-list indirect table, is used and arranged in 2 dimensional matrices with each column representing a physical comparator and associated table, as this enables a design to be built that can initiate more than one comparison per clock cycle.

Another example embodiment of the present disclosure provides the use of field selection per entry in the table with only the values and masks associated with selected bytes stored in hardware serial matching table. This allows significant compression of the table while allowing each entry to utilize independent masking patterns.

An example embodiment of the present disclosure provides the use of a union operation where configurable numbers of entries in rows of the sub-list table are to match before a key is considered to match. This allows the simultaneous matching of a key against multiple table entries in a single operation.

An example embodiment of the present disclosure provides an implementation of the HyperCut comparison tree using a single memory where the bits of the HyperCut form the least significant bits of the address used for look-up in a direct addressed SRAM. The read data from the SRAM provides the bits used for the next HyperCut and the most significant address bits for the next SRAM look-up. This example embodiment is for a specific implementation of a HyperCut that is described in scholarly papers.

An example embodiment of the present disclosure provides the concatenation of multiple leafs of the HyperCut into a single SRAM data word. This reduces the size of leaf entries by reducing the address space and improves the efficiency of ECC algorithms for SRAM in the SRAM based implementation of the HyperCut.

A specific example embodiment is implemented as part of a 20 Gbps-capable packet networking device for use in carrier packet access networks. The primary application for the device is mobile backhaul in converged packet networks.

The present disclosure provides background on masked matching employed in packet networking applications. The deficiencies of existing solutions are described along with exemplary embodiments that resolve these deficiencies.

In the preceding description, for purposes of explanation, numerous details are set forth in order to provide a thorough understanding of the embodiments. However, it will be apparent to one skilled in the art that these specific details are not required in order to practice the embodiments. In other instances, well-known electrical structures and circuits are shown in block diagram form in order not to obscure the embodiments. For example, specific details are not provided as to whether the embodiments described herein are implemented as a software routine, hardware circuit, firmware, or a combination thereof.

Embodiments can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment. Those of ordinary skill in the art will appreciate that other instructions and operations necessary to implement the described embodiments can also be stored on the machine-readable medium. Software running from the machine-readable medium can interface with circuitry to perform the described tasks.

The above-described embodiments are intended to be examples only. Alterations, modifications and variations can be effected to the particular embodiments by those of skill in the art without departing from the scope of the embodiments and the disclosure, which is defined solely by the claims appended hereto.

What is claimed is:

1. A protocol independent network packet classification processing system for matching a network packet to one of a plurality of rules organized into sub-lists, comprising:
   a compare tree engine for:
   (a) receiving the network packet;
   (b) accessing content of a preconfigured look up table encoded in a memory using a final address composed of data values obtained from the network packet at specific bit positions identified by a predetermined bit extraction pattern and a predetermined base address, wherein the content is one of a null value indicating absence of a match, a pointer associated with one of the sub-lists, or a new predetermined bit pattern and a new predetermined base address;
   (c) when the accessed content is the new predetermined bit pattern and the new predetermined base address, changing the final address such that the final address is composed of data values obtained from the network packet at specific bit positions identified by the new predetermined bit extraction pattern and the new predetermined base address;
   (d) repeating steps (b) and (c) until the accessed content from step (b) is one of a null value or a pointer associated with one of the sub-lists;
   (e) when the accessed content is a pointer associated with one of the sub-lists, outputting the pointer;
   a serial match engine for:
   receiving the pointer from the compare engine; and
   executing a linear search of each rule in the one sub-list associated with the received pointer to identify a highest matching precedent rule to preselected bit position values of the network packet.

2. The protocol independent network packet classification processing system of claim 1, wherein the new predetermined bit extraction pattern and the new predetermined base address are stored in a second memory, and wherein the accessed content of the preconfigured look-up table is a second pointer associated with an address in the second memory.

3. The protocol independent network packet classification processing system of claim 2, wherein the compare tree engine includes a data selector receiving data corresponding to all bit positions of the network packet.

4. The protocol independent network packet classification processing system of claim 3, wherein the data selector is configured to provide only the data values corresponding to the specific bit positions of the network packet identified by any one of the predetermined bit extraction pattern and the new predetermined bit extraction patterns.

5. The protocol independent network packet classification processing system of claim 2, wherein the memory is a branch memory and the second memory is a node memory.

6. The protocol independent network packet classification processing system of claim 1, wherein the predetermined bit extraction pattern and each new predetermined bit extraction pattern have a different number of bits.

7. The protocol independent network packet classification processing system of claim 5, wherein the compare tree engine further includes evaluation logic for receiving the accessed content from the branch memory and determining further actions in response to receiving the accessed content, the further actions including:
   flushing the network packet from a pipeline when the null value is received;
   outputting the first pointer associated with the one of the plurality of sub-lists to the serial match engine; and
   outputting the second pointer associated with an address in the node memory.

8. The protocol independent network packet classification processing system of claim 7, wherein the evaluation logic provides the second pointer to the node memory, and wherein the compare engine reads out one of the new predetermined bit extraction patterns and the new predetermined base addresses using the address associated with the second pointer.

9. The protocol independent network packet classification processing system of claim 8, wherein the data selector composes the final address by adding the predetermined base address to the data values obtained from the network packet.

10. The protocol independent network packet classification processing system of claim 9, wherein the node memory further stores a number of bits of interest with the predetermined bit extraction pattern and with each of the new predetermined bit extraction patterns and the new predetermined base addresses.

11. The protocol independent network packet classification processing system of claim 10, wherein the data selector limits a subset of the bits to the number of bits of interest provided with the predetermined bit extraction patterns and base addresses.

12. The protocol independent network packet classification processing system of claim 1, wherein the serial match engine includes a field selector for selecting the preselected bit position values of the network packet in response to a rule format of a selected rule of the sub-list, and a comparator for bitwise comparison of the preselected bit position values against data values of the selected rule, the comparator providing a match indication and corresponding priority level for the selected rule when the preselected bit position values match the data values of the selected rule.

13. The protocol independent network packet classification processing system of claim 12, wherein the field selector is a first field selector, the comparator is a first comparator, and the selected rule is a first selected rule, the serial match engine further including a second field selector for selecting another set of preselected bit position values of the network packet in response to a rule format of a second selected rule of the sub-list, and a second comparator for bitwise comparison of the another set of preselected bit position values against data values of the selected rule, the second comparator providing another match indication and corresponding priority level for the second selected rule when the another set of preselected bit position values match the data values of the second selected rule.

14. The protocol independent network packet classification processing system of claim 13, further including a priority comparator configured for determining which of the match indication and the another match indication has a higher priority.

15. The protocol independent network packet classification processing system of claim 13, further including a priority comparator configured for providing a compound match indication when the match indication and the another match indication is received.

16. The protocol independent network packet classification processing system of claim 9, wherein the data selector composes the new final address by adding the new predetermined base address to the data values obtained from the network packet.

17. The protocol independent network packet classification processing system of claim 1, wherein the compare engine and the search match engine cooperate to classify the network packet independent of a network protocol utilized to transmit the received network packet.

* * * * *